United States Patent
Ryu et al.

(10) Patent No.: US 7,646,640 B2
(45) Date of Patent: Jan. 12, 2010

(54) SEMICONDUCTOR MEMORY DEVICE

(75) Inventors: Je-Il Ryu, Seoul (KR); You-Sung Kim, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 47 days.

(21) Appl. No.: 11/951,170

(22) Filed: Dec. 5, 2007

(65) Prior Publication Data

US 2009/0040828 A1 Feb. 12, 2009

(30) Foreign Application Priority Data

Aug. 6, 2007 (KR) .................... 10-2007-0078553

(51) Int. Cl.
*G11C 16/04* (2006.01)
(52) U.S. Cl. .............. 365/185.11; 365/185.13; 365/185.25; 365/230.06
(58) Field of Classification Search ......... 365/185.11, 365/185.13, 185.25, 185.17, 230.03, 230.06
See application file for complete search history.

(56) References Cited

U.S. PATENT DOCUMENTS

| 6,545,910 | B2 * | 4/2003 | Byeon et al. ......... 365/185.17 |
| 7,180,786 | B2 * | 2/2007 | Mastrangelo et al. .. 365/185.23 |
| 7,286,439 | B2 * | 10/2007 | Fasoli et al. ......... 365/230.06 |

FOREIGN PATENT DOCUMENTS

| JP | 2005-222647 | 8/2005 |
| KR | 10-2006-0075361 A | 7/2006 |

* cited by examiner

*Primary Examiner*—David Lam
(74) *Attorney, Agent, or Firm*—Townsend and Townsend and Crew LLP

(57) ABSTRACT

A semiconductor memory device includes first and second memory cell blocks, a block decoder, and first and second block switches. The first and second memory cell blocks have a plurality of memory cells connected in a string structure and are respectively disposed in neighboring planes. The block decoder outputs first and second block select signals in response to pre-decoded address signals and first and second plane select signals, which are respectively enabled according to an enable state of the planes. The first and second block switches connect global word lines to word lines of the first and second memory cell blocks in response to the first and second block select signals, respectively.

8 Claims, 2 Drawing Sheets

SEMICONDUCTOR MEMORY DEVICE

CROSS-REFERENCES TO RELATED APPLICATIONS

The present application claims priority to Korean patent application number 10-2007-78553, filed on Aug. 6, 2007, which is incorporated by reference in its entirety.

BACKGROUND OF THE INVENTION

The present invention relates to semiconductor memory devices and, more particularly, to a semiconductor memory device, in which one block decoder controls two memory cell blocks, thus improving the level of integration.

In recent years, there is an increasing demand for semiconductor memory devices, enabling electrical program and erasure and not requiring a periodical refresh function. Further, in order to develop large-capacity memory devices capable of storing a high capacity of data, research has been done into a technique of higher integration of memory devices. Active research has been done into flash memory.

Flash memory is generally classified into NAND type flash memory and NOR type flash memory. NOR type flash memory has a structure in which memory cells are connected to bit lines and word lines independently and, therefore, has a good random access time. In contrast, NAND type flash memory has a structure in which a plurality of memory cells are connected in series and only one contact per cell string is required and therefore has good integration. Thus, the NAND type structure is generally used in high-integration flash memory.

In general, a flash memory device requires a block decoder for performing a memory cell array on a block basis in order to perform program, read, and erase operations on a memory cell.

FIG. 1 is a circuit diagram of a conventional flash memory device for illustrating a block decoder.

Referring to FIG. 1, a NAND gate ND1 receives address signals XA, XB, XC and XD and performs a NAND operation on the address signals. A NAND gate ND2 receives an output signal from the NAND gate ND1 and a program precharge signal PGMPREb, and performs a NAND operation on the signals. When at least one of the address signals XA, XB, XC and XD is in a low level, the NAND gate ND1 outputs a signal of a high level. When one or more of the output signal of the NAND gate ND1 and the program precharge signal PGMPREb is in a low level, the NAND gate ND2 outputs a signal of a high level.

A NAND gate ND3 performs a NAND operation on an output signal of the NAND gate ND2 and a block enable signal EN. When the block enable signal EN is in a low level, the NAND gate ND3 outputs a signal of a high level to turn on a transistor N2. Accordingly, a node Q1 is reset.

A transistor N1 is turned on in response to a precharge signal PRE, so that an output signal of the NAND gate ND2 is applied to the node Q1. A voltage level of the node Q1 serves as a block select signal BLKWL. Meanwhile, transistors N3 and N4 are turned on in response to first and second control signals GA and GB of a pumping voltage (Vpp) level, respectively, so that the pumping voltage Vpp is applied to the node Q1. Accordingly, a block switch 20 operates in response to a voltage level of the node Q1 (i.e., the block select signal BLKWL), so that global word lines GWL<31:0> and word lines of a memory cell array 30 are connected.

BRIEF SUMMARY OF THE INVENTION

The present invention is directed towards semiconductor memory devices, in which two memory cell blocks are controlled by using one block decoder, so that an area occupied by block decoders can be reduced and the level of integration can be improved.

In one embodiment, a semiconductor memory device includes first and second memory cell blocks, a block decoder, and first and second block switches. The first and second memory cell blocks have a plurality of memory cells connected in a string structure and are respectively disposed in neighboring planes. The block decoder outputs first and second block select signals in response to pre-decoded address signals and first and second plane select signals, which are respectively enabled according to an enable state of the planes. The first and second block switches connect global word lines to word lines of the first and second memory cell blocks in response to the first and second block select signals, respectively.

The block decoder includes a control signal generator for outputting first and second control signals in response to the pre-decoded address signals, first and second program precharge signals, and the first and second plane select signals, a first precharge unit for precharging a first output node in response to first and second high-voltage decoding signals and a first high voltage plane select signal, a second precharge unit for precharging a second output node in response to the first and second high-voltage decoding signals and a second high voltage plane select signal, a first enable unit for controlling a voltage level of the first output node in response to the first control signal and a first block enable signal, and a second enable unit for controlling a voltage level of the second output node in response to the second control signal and a second block enable signal.

The e control signal generator includes a first NAND gate for performing a NAND operation on the pre-decoded address signals and outputting a combination signal, a second NAND gate for performing a NAND operation on the combination signal, the first program precharge signal, and the first plane select signal and outputting the first control signal, and a third a NAND gate for performing a NAND operation on the combination signal, the second program precharge signal, and the second plane select signal and outputting the second control signal.

The first precharge unit comprises first to third NMOS transistors connected in series between a high voltage power supply and the first output terminal. The first to third NMOS transistors are turned on in response to the first high voltage plane select signal, and the first and second high-voltage decoding signals, respectively, and precharge the first output node to the high voltage power supply level.

The second precharge unit includes first to third NMOS transistors connected in series between a high voltage power supply and the second output terminal. The first to third NMOS transistors are turned on in response to the second high voltage plane select signal, and the first and second high-voltage decoding signals, respectively, and precharge the second output node to the high voltage power supply level.

The first enable unit includes a NAND gate for performing a NAND operation on the first control signal and the first block enable signal and outputting a discharge signal, and a NMOS transistor connected between the first output node and a ground power supply and configured to discharge the first output node in response to the discharge signal.

The second enable unit includes a NAND gate for performing a NAND operation on the second control signal and the second block enable signal and outputting a discharge signal, and a NMOS transistor connected between the second output node and a ground power supply and configured to discharge the second output node in response to the discharge signal.

The block decoder is configured to enable and output only one of the first and second block select signals when the first and second memory cell blocks are disposed on the same layer, and enable and output at least one of the first and second block select signals when the first and second memory cell blocks are disposed in a multi-plane disposed on different layers.

DESCRIPTION OF SPECIFIC EMBODIMENTS

A specific embodiment according to the present patent will be described with reference to the accompanying drawings.

Figure 1:
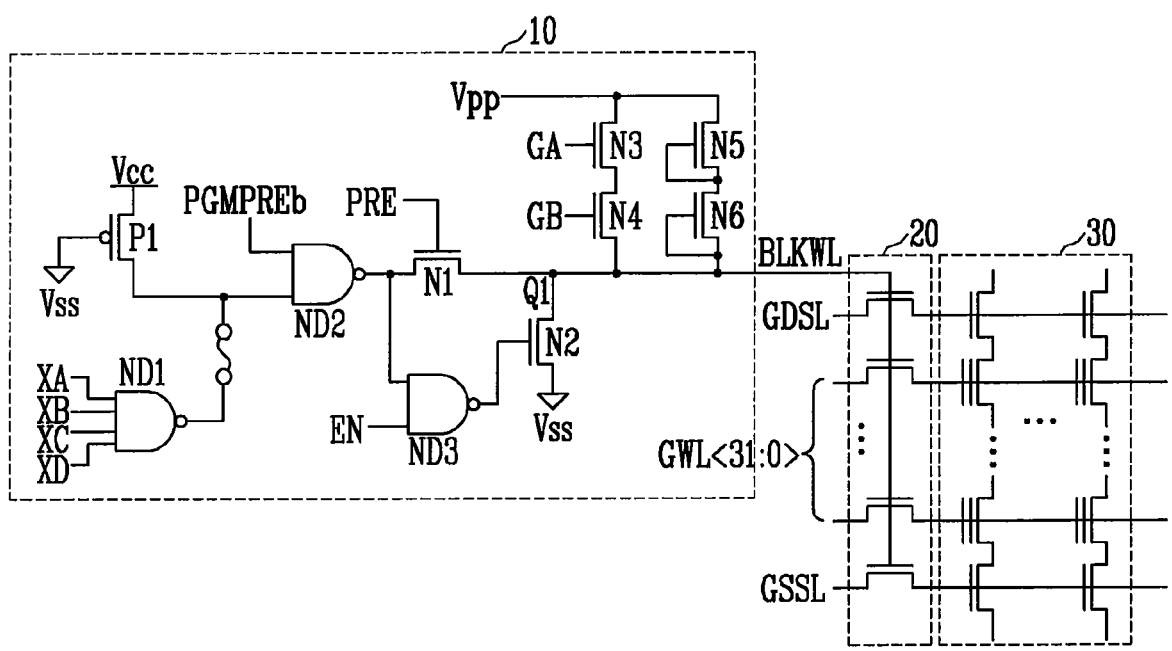
FIG. 1 is a circuit diagram illustrating a conventional semiconductor memory device.
Figure 2:
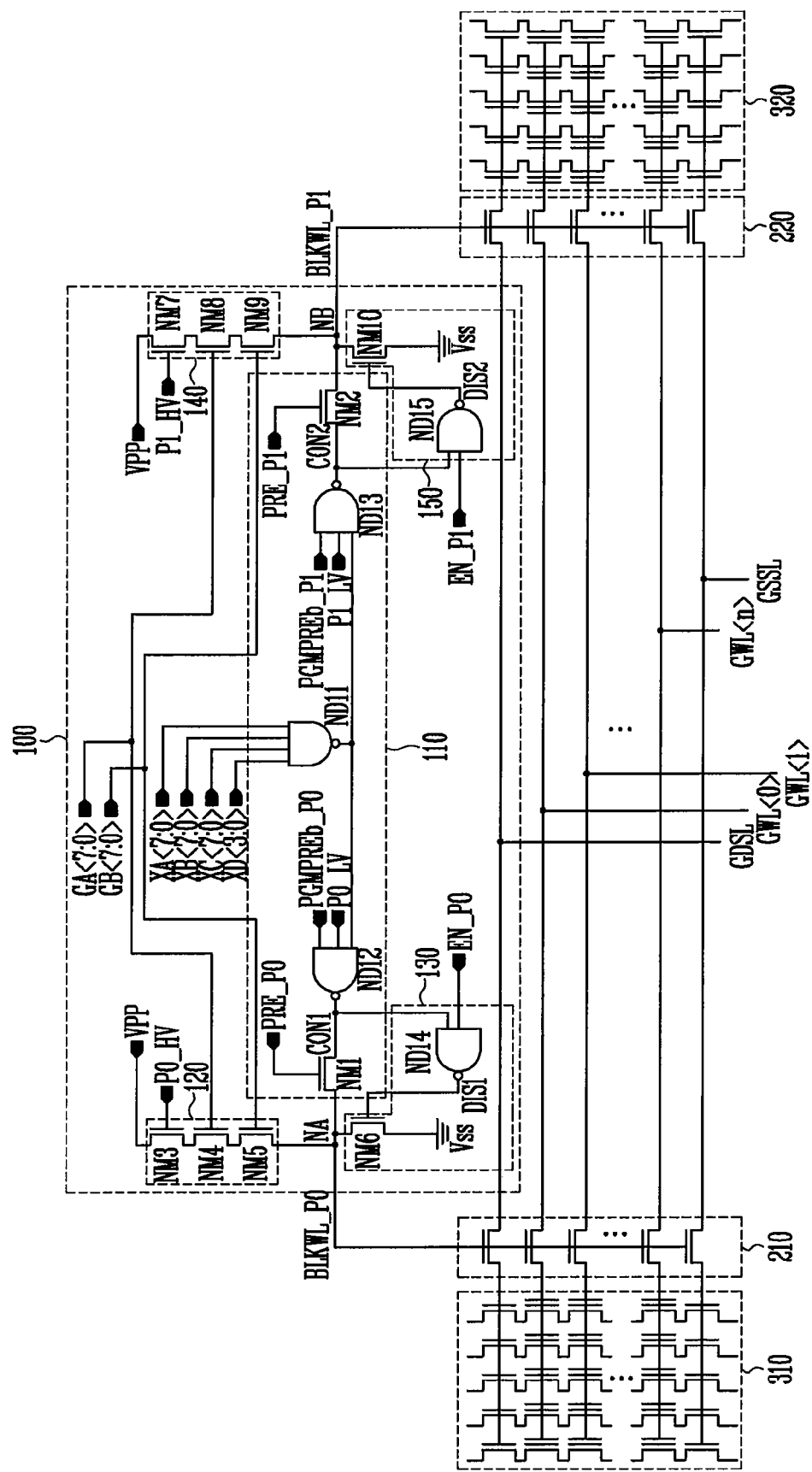
FIG. 2 is a circuit diagram illustrating a semiconductor memory device according to an embodiment of the present invention.

FIG. 2 is a circuit diagram illustrating a semiconductor memory device according to an embodiment of the present invention.

Referring to FIG. 2, the semiconductor memory device according to an embodiment of the present invention includes first and second memory cell blocks 310, 320 in which a plurality of memory cells are connected in a string structure and are disposed in neighboring planes, a block decoder 100 for outputting first and second block select signals BLKWL_P0, BLKWL_P1 in response to pre-coded address signals XA<7:0>, XB<7:0>, XC<7:0>, and XD<3:0> at the time of a program or read operation, and first and second block switches 210, 220 for connecting global word lines GWL<0:n> to the first and second memory cell blocks 310, 320, respectively, in response to the first and second block select signals BLKWL_P0, BLKWL_P1, respectively.

The block decoder 100 includes a control signal generator 110 for outputting first and second control signals CON1, CON2 in response to the pre-decoded address signals XA<7:0>, XB<7:0>, XC<7:0>, and XD<3:0>, first and second program precharge signals PGMPREb_P0, PGMPREb_P1, and first and second plane select signals P0_LV, P1_LV, a first precharge unit 120 for precharging an output node NA in response to first and second high-voltage decoding signals GA, GB and a first high voltage plane select signal P0_HV, a second precharge unit 140 for precharging an output node NB in response to the first and second high-voltage decoding signals GA, GB and a second high voltage plane select signal P1_HV, a first enable unit 130 for controlling a voltage level of the output node NA in response to the first control signal CON1 and a first block enable signal EN_P0, and a second enable unit 150 for controlling a voltage level of the output node NB in response to the second control signal CON2 and a second block enable signal EN_P1.

The control signal generator 110 includes first to third NAND gates ND11 to ND13, and NMOS transistors NM1, NM2. The first NAND gate ND11 performs a NAND operation on the pre-decoded address signals XA<7:0>, XB<7:0>, XC<7:0>, and XD<3:0> and outputs a combination signal. The second NAND gate ND12 performs a NAND operation on the combination signal output from the first NAND gate ND11, the first program precharge signal PGMPREb_P0, and the first plane select signal P0_LV, and outputs the first control signal CON1. The third NAND gate ND13 performs a NAND operation on the combination signal output from the first NAND gate ND11, the second program precharge signal PGMPREb_P1, and the second plane select signal P1_LV, and outputs the second control signal CON2. The NMOS transistor NM1 is turned on or off in response to a first precharge signal PRE_P0, and transmits the first control signal CON1 to the output node NA. The NMOS transistor NM2 is turned on or off in response to a second precharge signal PRE_P1, and transmits the second control signal CON2 to the output node NB.

The first precharge unit 120 includes NMOS transistors NM3 to NM5 connected in series between a high voltage power supply Vpp and the output node NA. The NMOS transistors NM3 to NM5 are turned on in response to the first high voltage plane select signal P0_HV, and the first and second high-voltage decoding signals GA, GB, respectively, and precharge the output node NA to the high voltage power supply (Vpp) level. The first high voltage plane select signal P0_HV is an external control signal and is applied to unselected blocks in a disable state, so that it can preclude the high voltage power supply Vpp applied to the first precharge unit 120, reducing power consumption.

The first enable unit 130 includes a NAND gate ND14 and a NMOS transistor NM6. The NAND gate ND14 performs a NAND operation on the first control signal CON1 and the first block enable signal EN_P0, and outputs a first discharge signal DIS1. The NMOS transistor NM6 is connected between the output node NA and a ground power supply Vss, and discharges the output node NA to a ground power supply (Vss) level in response to the first discharge signal DIS1.

The second precharge unit 140 includes NMOS transistors NM7 to NM9 connected in series between the high voltage power supply Vpp and the output node NB. The NMOS transistors NM7 to NM9 are turned on in response to the second high voltage plane select signal P1_HV, and the first and second high-voltage decoding signals GA, GB, respectively, and precharge the output node NB to the high voltage power supply (Vpp) level. The second high voltage plane select signal P1_HV is an external control signal and is applied to unselected blocks in a disable state, so that it can preclude the high voltage power supply Vpp applied to the second precharge unit 140, reducing power consumption.

The second enable unit 150 includes a NAND gate ND15 and a NMOS transistor NM10. The NAND gate ND14 performs a NAND operation on the second control signal CON2 and the second block enable signal EN_P1, and outputs a second discharge signal DIS2. The NMOS transistor NM10 is connected between the output node NB and the ground power supply Vss, and discharges the output node NB to the ground power supply (Vss) level in response to the second discharge signal DIS2.

An operation in which the semiconductor memory device of the present invention selects the first memory block 310 at the time of a program or read operation is described below in connection with an embodiment.

All the pre-decoded address signals XA<7:0>, XB<7:0>, XC<7:0>, and XD<3:0> are input as a high level, and therefore the first NAND gate ND1 outputs a low level.

The first precharge unit 120 precharges the output node NA to the high voltage (Vpp) level in response to the first and second high-voltage decoding signals GA, GB and the first high voltage plane select signal P0_HV.

The second NAND gate ND12 outputs the first control signal CON1 of a high level in response to a low level, which is output from the first NAND gate ND11, and the first plane select signal PO_LV of a high level and the first program precharge signal PGMPREb_P0 of a low level, for selecting the first memory block 310.

The NAND gate ND14 of the first enable unit 130 performs a NAND operation on the first control signal CON1 of a high level and the first block enable signal EN_P0 of a high level, and outputs the first discharge signal DIS1 of a low level. The NMOS transistor NM6 is turned on/off in response to the first discharge signal DIS1 of a low level.

Consequently, a voltage level of the node NA, which has been precharged to the high voltage level Vpp is output as the first block select signal BLKWL_P0, thus enabling the first block switch 210.

The first block switch 210 have their transistors turned on in response to the first block select signal BLKWL_P0 of the high voltage level, and connects the global word lines GWL<0:n> to the word lines of the first memory cell block 310.

At this time, the second precharge unit 140 precludes the connection of the high voltage Vpp to the output node NB in response to the second high voltage plane select signal P1_HV of a low level.

Due to this, the second block select signal BLKWL_P1 is output as a low level and thus disables the second block switch 210.

An example in which the block decoder according to an embodiment of the present invention operates to select one of the first and second memory cell blocks 310, 320 disposed in neighboring planes of a single layer of a flash memory device has been described above as an example. However, in the case of the first and second memory cell blocks 310, 320, which are disposed in a multi-plane of a multi-layer structure and disposed in different layers, the first and second memory cell blocks 310, 320 can be enabled at the same time so that a program or read operation can be performed. This can have the above effects by applying the first high voltage plane select signal P0_HV and the first block enable signal EN_P0 for selecting the first memory cell block 310, which have the same signal level, and the second high voltage plane select signal P1_HV and the second block enable signal EN_P1 for selecting the second memory cell block 320, which have the same signal level.

As described above, according to the present invention, two memory cell blocks can be controlled by using one block decoder. Accordingly, an area occupied by block decoders can be reduced, and the level of integration of devices can be improved.

Although the foregoing description has been made with reference to the specific embodiments, it is to be understood that changes and modifications of the present patent may be made by the ordinary skilled in the art without departing from the spirit and scope of the present patent and appended claims.

What is claimed is:

1. A semiconductor memory device, comprising:
   a first plane including a plurality of first memory blocks;
   a second plane including a plurality of second memory blocks;
   a block decoder to output first and second block select signals for selecting one first memory block of the first plane and one second memory cell block of the second plane, respectively, in response to pre-decoded address signals and first and second plane select signals, which are respectively enabled according to an enable state of the first and second planes;
   a first block switch to connect a global word line to word lines of the selected first memory cell block of the first plane in response to the first block select signal; and
   a second block switch to connect a global word line to word lines of the selected second memory cell block of the second plane in response to the second block select signal.

2. The semiconductor memory device of claim 1, wherein the block decoder comprises:
   a control signal generator to output first and second control signals in response to the pre-decoded address signals, first and second program precharge signals, and the first and second plane select signals;
   a first precharge unit to precharge a first output node in response to first and second high-voltage decoding signals and a first high voltage plane select signal;
   a second precharge unit to precharge a second output node in response to the first and second high-voltage decoding signals and a second high voltage plane select signal;
   a first enable unit to control a voltage level of the first output node in response to the first control signal and a first block enable signal; and
   a second enable unit to control a voltage level of the second output node in response to the second control signal and a second block enable signal.

3. The semiconductor memory device of claim 2, wherein the control signal generator comprises:
   a first NAND gate to perform a NAND operation on the pre-decoded address signals and output a combination signal;
   a second NAND gate to perform a NAND operation on the combination signal, the first program precharge signal, and the first plane select signal and output the first control signal; and
   a third NAND gate to perform a NAND operation on the combination signal, the second program precharge signal, and the second plane select signal and output the second control signal.

4. The semiconductor memory device of claim 2,
   wherein the first precharge unit comprises first to third NMOS transistors connected in series between a high voltage power supply and the first output terminal, and
   wherein the first to third NMOS transistors are turned on in response to the first high voltage plane select signal, and the first and second high-voltage decoding signals, respectively, and precharge the first output node to the high voltage power supply level.

5. The semiconductor memory device of claim 2,
   wherein the second precharge unit comprises first to third NMOS transistors connected in series between a high voltage power supply and the second output terminal, and
   wherein the first to third NMOS transistors are turned on in response to the second high voltage plane select signal, and the first and second high-voltage decoding signals, respectively, and precharge the second output node to the high voltage power supply level.

6. The semiconductor memory device of claim 2, wherein the first enable unit comprises:
   a NAND gate to perform a NAND operation on the first control signal and the first block enable signal and output a discharge signal; and
   a NMOS transistor connected between the first output node and a ground power supply and configured to discharge the first output node in response to the discharge signal.

7. The semiconductor memory device of claim 2, wherein the second enable unit comprises:
- a NAND gate to perform a NAND operation on the second control signal and the second block enable signal and output a discharge signal; and
- a NMOS transistor connected between the second output node and a ground power supply and configured to discharge the second output node in response to the discharge signal.

8. The semiconductor memory device of claim 1, wherein the block decoder is configured to enable and output no more than one of the first and second block select signals when the first and second planes are disposed on the same layer, and enable and output one or both of the first and second block select signals when the first and second planes are disposed in a multi-plane disposed on different layers.

* * * * *